United States Patent
Lim

(10) Patent No.: US 7,692,379 B2
(45) Date of Patent: Apr. 6, 2010

(54) DISPLAY DEVICE WITH REFLECTIVE STRUCTURE FOR IMPROVED LIGHT EMISSION

(75) Inventor: Jong-Sun Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 691 days.

(21) Appl. No.: 11/349,303

(22) Filed: Feb. 7, 2006

(65) Prior Publication Data

US 2006/0175965 A1 Aug. 10, 2006

(30) Foreign Application Priority Data

Feb. 7, 2005 (KR) ............... 10-2005-0011466

(51) Int. Cl.
*H01J 1/62* (2006.01)
*H01J 63/04* (2006.01)
*G02B 27/10* (2006.01)

(52) U.S. Cl. ............. 313/506; 313/502; 313/503; 428/690; 359/622

(58) Field of Classification Search .......... 313/501–512
See application file for complete search history.

(56) References Cited

U.S. PATENT DOCUMENTS

| | | | | |
|---|---|---|---|---|
| 5,652,067 A * | 7/1997 | Ito et al. | ............... | 428/690 |
| 6,652,996 B2 * | 11/2003 | Steklenski et al. | ............. | 428/690 |
| 6,756,732 B1 * | 6/2004 | Kawase | ............... | 313/504 |
| 2003/0020399 A1 * | 1/2003 | Moller et al. | ............. | 313/504 |
| 2004/0119405 A1 * | 6/2004 | Fukuda | ............... | 313/506 |
| 2004/0211971 A1 * | 10/2004 | Takei et al. | ............. | 257/98 |
| 2005/0105186 A1 * | 5/2005 | Kaminsky et al. | ............. | 359/599 |
| 2005/0142976 A1 * | 6/2005 | Suzuki | ............... | 445/24 |
| 2005/0162073 A1 * | 7/2005 | Suzuki | ............... | 313/504 |

FOREIGN PATENT DOCUMENTS

| | | |
|---|---|---|
| CN | 1484349 | 3/2004 |
| JP | 10041071 | 2/1998 |
| JP | 10223367 | 8/1998 |
| JP | 2002110362 | 4/2002 |
| JP | 2003291406 | 10/2003 |
| JP | 2003337205 | 11/2003 |
| JP | 2004004176 | 1/2004 |
| JP | 2004127662 | 4/2004 |
| JP | 2004227929 | 8/2004 |
| KR | 100306237 | 8/2001 |
| KR | 1020010076277 | 8/2001 |
| KR | 1020030011657 | 2/2003 |
| KR | 1020030057017 | 7/2003 |
| KR | 2003-0072349 | 9/2003 |
| KR | 1020040029433 | 4/2004 |
| KR | 1020040071066 | 8/2004 |
| KR | 1020040074956 | 8/2004 |

* cited by examiner

*Primary Examiner*—Sikha Roy
*Assistant Examiner*—Tracie Green
(74) *Attorney, Agent, or Firm*—Cantor Colburn LLP

(57) ABSTRACT

A display device including a transparent substrate having a first surface and a second surface; a first electrode that is transparent and formed the first surface of the substrate; a light emitting layer formed on the first electrode; a second electrode formed on the light emitting layer; and a lens formed on the second surface of the substrate. The display device further includes a reflective plate formed between the first surface of the substrate and the first electrode or between the second surface of the substrate and the lens and including a plurality of thin films.

22 Claims, 4 Drawing Sheets

DISPLAY DEVICE WITH REFLECTIVE STRUCTURE FOR IMPROVED LIGHT EMISSION

This application claims priority to Korean Patent Application No. 10-2005-0011466 filed on Feb. 7, 2005, and all the benefits accruing therefrom under 35 U.S.C. §119, the contents of which are herein incorporated by reference in its entirety.

BACKGROUND OF THE INVENTION (a) Field of the Invention

The present invention relates to a display device.

(b) Description of Related Art

Recent trends of light-weight and thin personal computers, televisions sets that require light-weight and thin display devices, and flat panel displays satisfying such a requirement are being substituted for conventional cathode ray tubes (CRT).

The flat panel displays include a liquid crystal display (LCD), field emission display (FED), organic light emitting diode (OLED) display, plasma display panel (PDP), and the like.

Generally, an active matrix flat panel display includes a plurality of pixels arranged in a matrix and displays images by controlling the luminance of the pixels based on given luminance information. An OLED display is a self-emissive display device that displays images by electrically exciting light emitting organic material, and has low power consumption, wide viewing angle, and fast response time, thereby being advantageous for displaying motion images.

A pixel of an OLED display includes an OLED and a driving thin film transistor (TFT). The TFT includes polysilicon or amorphous silicon. A polysilicon TFT has several advantages, but it also has disadvantages such as the complexity of manufacturing polysilicon, thereby increasing the manufacturing cost. In addition, it is hard to make an OLED display employing polysilicon TFTs be large.

On the contrary, an amorphous silicon TFT is easily applicable to a large OLED display and manufactured by less number of process steps than the polysilicon TFT. However, the threshold voltage of the amorphous silicon TFT shifts over time due to a long-time application of a unidirectional voltage to a gate of the TFT such that the current flowing in the OLED is non-uniform, the image quality is degraded and the lifetime of the OLED is shortened.

An OLED display, in particular, a bottom emission OLED display, includes a transparent anode made of indium tin oxide (ITO), etc., a light emitting layer, and an opaque cathode, which are sequentially formed on a glass substrate. In this structure, the anode, boundary surfaces of the substrate, and the cathode form a light guide that prevents about 50% of the emitted light from escaping. About 30% of the emitted light is destructed due to the total reflection at the substrate surface between the substrate and the air. Therefore, the theoretical efficiency of the outward light emission is equal to about 20%.

In addition, an anti-reflection film used for improving contrast ratio may drop the actual light emission efficiency below about 10%.

SUMMARY OF THE INVENTION

A display device according to an embodiment of the present invention includes: a transparent substrate having a first surface and a second surface; a first electrode that is transparent and formed the first surface of the substrate; a light emitting layer formed on the first electrode; a second electrode formed on the light emitting layer; and a lens formed on the second surface of the substrate. The OLED display further includes a reflective plate formed between the first surface of the substrate and the first electrode or between the second surface of the substrate and the lens and including a plurality of thin films The reflective plate may be a Bragg reflective plate.

The thin films may include organic or inorganic material, and the thin films may include both an inorganic film and an organic film. The thin films may include silicon nitride or silicon oxide.

The lens may be smaller than the first electrode and may have a diameter equal to or less than about 5 microns. The lens may include a concave lens or a convex lens.

The display device may further include a thin film transistor disposed between the reflective plate and the first electrode and coupled to the first electrode.

BRIEF DESCRIPTION OF THE DRAWINGS

The present invention will become more apparent by describing embodiments thereof in detail with reference to the accompanying drawing in which.

DETAILED DESCRIPTION OF THE INVENTION

Figure 1:
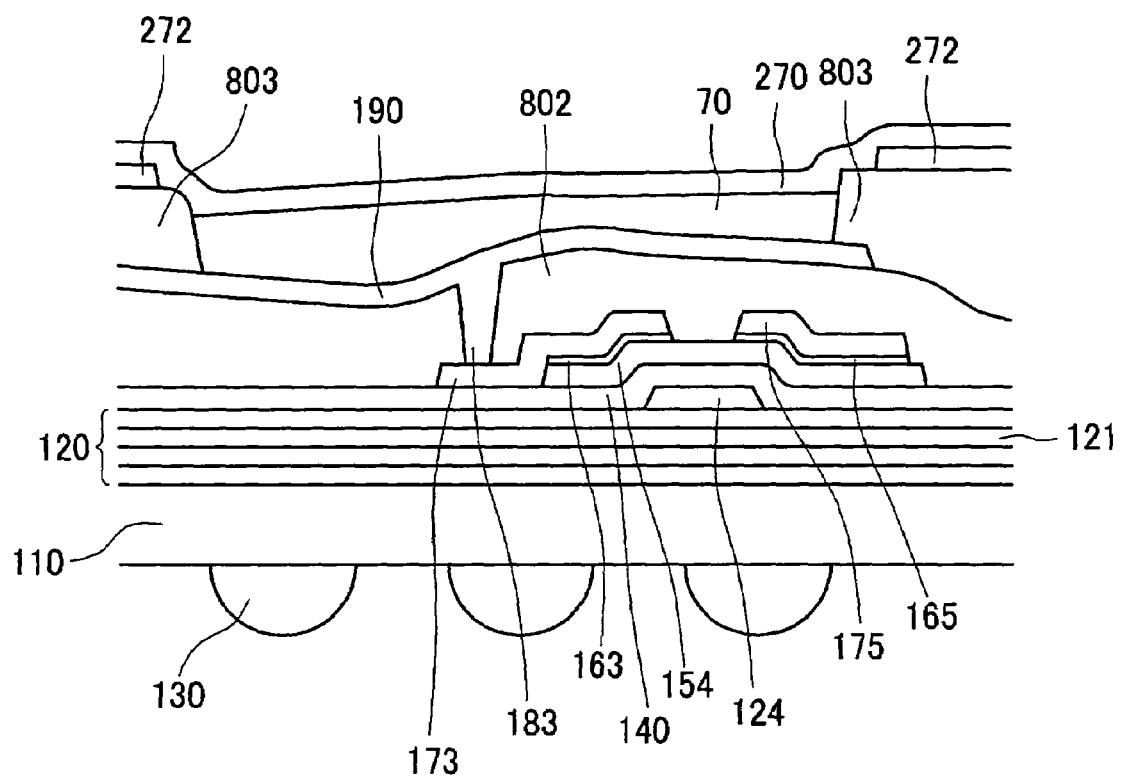
FIG. 1 is a sectional view of an exemplary embodiment of an organic light emitting diode (OLED) display according to the present invention.

The present invention now will be described more fully hereinafter with reference to the accompanying drawings, in which preferred embodiments of the invention are shown.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower" and "upper" and the like, may be used herein for ease of description to describe the relationship of one element or feature to another element (s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented as "upper" to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
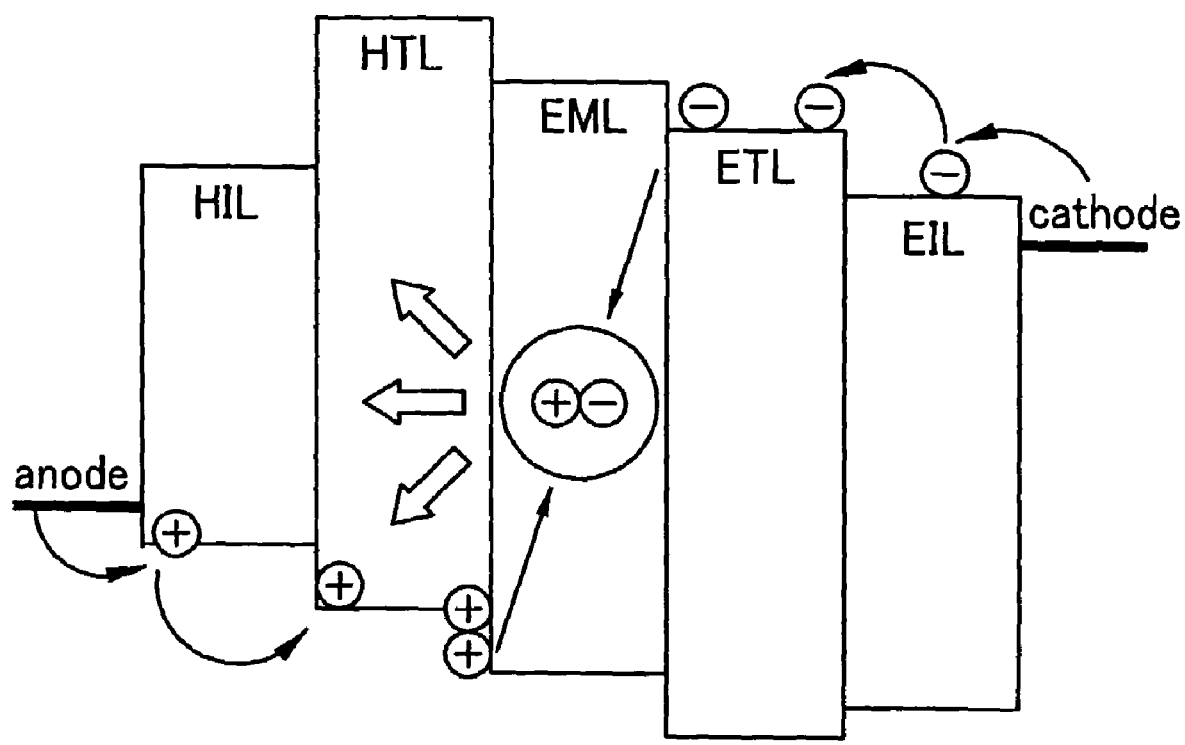
FIG. 2 is a sectional view of an exemplary embodiment of an organic light emitting layer.

Hereinafter, the present invention will be described in detail with reference to the accompanying drawings. An exemplary embodiment of an organic light emitting diode display according to the present invention will be described in detail with reference to FIGS. 1 and 2. FIG. 1 is a sectional view of an exemplary embodiment of an organic light emitting diode display according to the present invention, and FIG. 2 is a sectional view of an exemplary embodiment of an organic light emitting layer.

Referring to FIG. 1, a reflective plate 120 is formed on an upper surface of an insulating substrate 110.

The reflective plate 120 is a Bragg reflective plate and includes at least two of a unit structure 121. In exemplary embodiments, each unit structure 121 may include a plurality of thin films having difference refractive indices. These films may be laminated together. In other exemplary embodiments, the plurality of thin films may include only inorganic thin films, only organic thin films, or both inorganic thin films and organic thin films.

In an exemplary embodiment, the unit structure 121 may include a silicon nitride film and a silicon oxide film. The nitride film may have a thickness of about 70 nm and a refractive index equal to about 1.75 for a light having a wavelength of about 523 nm. The oxide film may have a thickness of about 90 nm and a refractive index equal to about 1.47 for a light having a wavelength of about 523 nm. The reflective plate 120 shown in FIG. 1 includes four unit structures 121.

A plurality of convex micro lenses 130 is formed on a lower surface of the substrate 110. In exemplary embodiments, each of the lenses 130 may have a diameter lower than about 5 microns. In alternative exemplary embodiments, the lenses 130 may be concave lenses or include both convex and concave lenses.

A control electrode 124 is formed on the reflective plate 120. The control electrodes 124 has a lateral surface inclined with respect to the surfaces of the substrate 110. In exemplary embodiments, the inclination angle thereof may range from about 20 degrees to about 80 degrees.

As illustrated in FIG. 1, an insulating layer 140 is formed on the control electrodes 124. The insulating layer 140 may be made of a silicon nitride (SiNx).

A semiconductor member 154 is formed on the insulating layer 140. The semiconductor member 154 may be made of hydrogenated amorphous silicon (abbreviated to a-Si) or polycrystalline silicon.

Ohmic contacts 163 and 165 are formed on the semiconductor member 154. The ohmic contacts 163 and 165 may be made of silicide or hydrogenated amorphous silicon heavily doped with n-type impurity. As illustrated in FIG. 1, the semiconductor member 154 and the ohmic contacts 163 and 165 may have lateral sides making an inclination angle of about 30-80 degrees with respect to the substrate 110.

An output electrode 173 and input electrode 175 are formed one the ohmic contacts 163 and 165 and the insulating layer 140. The output electrode 173 and the input electrode 175 are separated from each other and disposed opposite each other with respect to the control electrodes 124. The control electrode 124, the output electrode 173, and the input electrode 175 as well as the semiconductor member 154 form a driving transistor. A channel of the driving transistor is formed in or on a portion of the semiconductor member 154 between the output electrode 173 and the input electrode 175.

Referring again to FIG. 1, the output electrode 173 and the input electrode 175 have lateral surfaces having an inclination of about 30-80 degrees with respect to the substrate 110.

A passivation layer 802 is formed on the output electrode 173, the input electrode 175, and exposed portions of the semiconductor member 154. The passivation layer 802 may include, but is not limited to, organic material, low dielectric insulating material such as a-Si:C:O and a-Si:O:F formed by plasma enhanced chemical vapor deposition (PECVD) and like methods, or silicon nitride (SiNx). The material for the passivation layer 802 may create a non-light sensitive (flat) surface or may be configured for a surface to have photosensitivity. Referring again to FIG. 1, the passivation layer 802 includes a contact hole 183 exposing the output electrode 173.

A pixel electrode 190 is formed on the passivation layer 802. The pixel electrode 190 is physically and electrically connected to the output electrode 173 through the contact hole 183. The pixel electrode 190 may include transparent conductive material such as indium tin oxide (ITO) or indium zinc oxide (IZO).

A partition 803 is formed on the passivation layer 802. The partition 803 may be made of organic or inorganic insulating material. The partition 803 encloses or surrounds the periphery of the pixel electrode 190 to define a predetermined area.

An organic light emitting member 70 is formed on the pixel electrode 190 and enclosed by the partition 803.

The organic light emitting member 70, as shown in FIG. 2, has a multi-layered structure. Layers may include, but are not limited to, an emitting layer (EML), an electron transport layer (ETL) and a hole transport layer (HTL) for balancing the electrons and holes. In other exemplary embodiments, the organic light emitting member 70 may further include an electron injecting layer (EIL) and a hole injecting layer (HIL).

A subsidiary electrode 272 is formed on the partition 803. The subsidiary electrode 272 may be configured to have a shape similar to the partition 803 and may be made of conductive material, such as metal having low resistivity.

A common electrode 270 is formed on the partition 803, the organic light emitting member 70, and the subsidiary electrode 272. The common electrode 270 is supplied with a common voltage. The common electrode 270 may include, but is not limited to, metal such as Aluminum (Al), silver (Ag), calcium (Ca) and barium (Ba). The subsidiary electrode 272 is configured to prevent the signal of the common electrode 270 from being distorted. In other exemplary embodiments, the subsidiary electrode 272 may be omitted.

Another exemplary embodiment may be configured to include a combination of transparent pixel electrodes 190 and an opaque common electrode 270 employed to a bottom emission OLED display for emitting light toward the bottom of the display panel 300.

A pixel electrode 190, an organic light emitting member 70, and a common electrode 270 form an OLED display having the pixel electrode 190 as an anode and the common electrode 270 as a cathode or vice versa. The OLED display may uniquely emit one of primary color lights depending on the material of the emitting layer EML. An exemplary set of the primary colors includes red, green, and blue and the display of images may be realized by the addition of the three primary colors.

In the OLED display, light incident onto the Bragg reflective plate 120 is reflected or refractively transmitted at the boundaries of the laminated thin films. The constructive interference of the light reflected at the boundaries of the thin films occurs under so called "Bragg condition." Lights having wavelengths that satisfy the Bragg condition are substantially reflected and not transmitted, thereby forming so called "a photonic band gap."

Advantageously, the Bragg reflective plate 120 serves as a semi-transmissive (or translucent) mirror and the cathode, i.e., the common electrode 270, serves as a substantial or essentially total reflection mirror, thereby improving the efficiency of outward light emission.

In alternative exemplary embodiments, the reflective plate 120 may also be disposed between the thin film transistor and the pixel electrode 190.

The lenses 130 under the substrate 110 may lessen the straightness of the light from the reflective plate 120 such that the light has an intensity distribution close to a Lambertian distribution.

For this purpose, a micro lens film including several randomly arranged micro lenses 130 may be disposed on the substrate 110 and/or the reflective plate 120. In exemplary embodiments, the micro lenses may have a diameter equal to about five microns. The micro lens film may reduce the destruction of the emitted light at the boundary surface of the substrate 110 and the air to improve the efficiency of outward light emission. In addition, the micro lens film serves as a diffusion film that diffuses outward lights, thereby reducing the variance of the color coordinates and the light intensity depending on the viewing directions.

Another exemplary embodiment of an OLED display according to the present invention will be described in detail with reference to FIG. 3.

Figure 3:
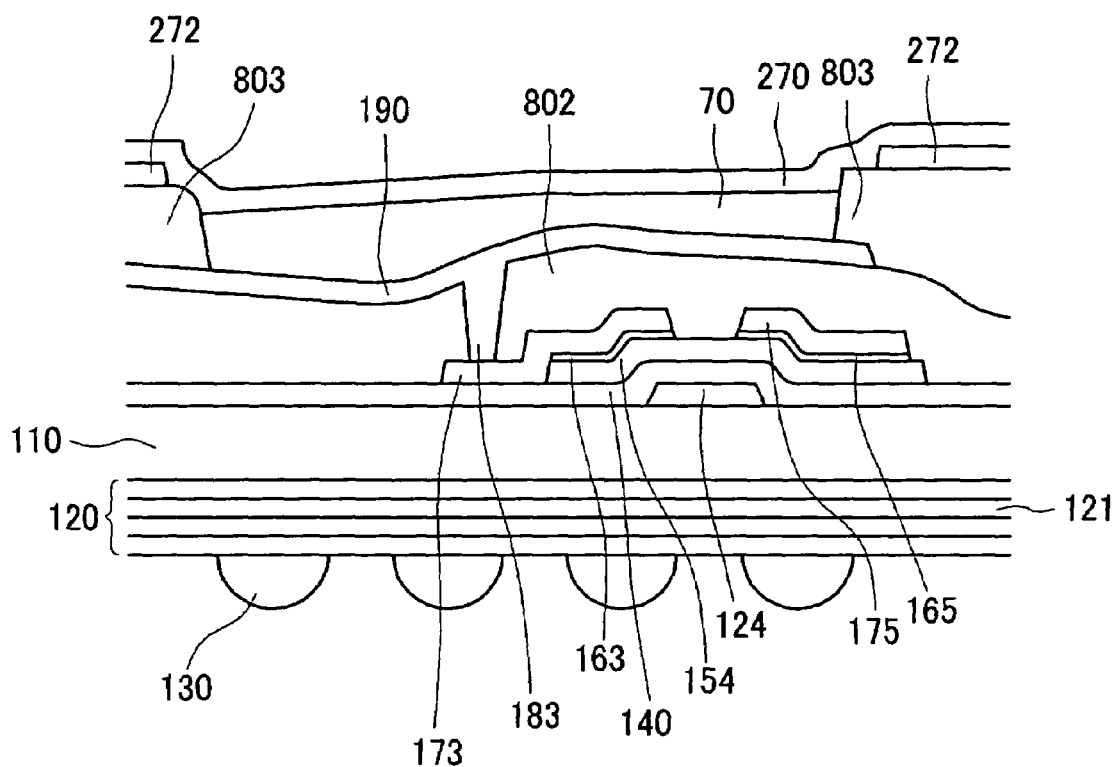
FIG. 3 is a sectional view of another exemplary embodiment of an OLED display according to the present invention.

FIG. 3 is a sectional view of an exemplary embodiment of an OLED display according to the present invention.

Referring to FIG. 3, a layered structure of an OLED display is substantially similar to that shown in FIG. 1.

That is, a plurality of micro lenses 130 are formed under an insulating substrate 110, and a control electrode 124 is formed on the substrate 110. An insulating layer 140, a semiconductor member 154 and ohmic contacts 163 and 165 are sequentially formed on the substrate 110 and the control electrodes 124. An output electrode 173 and an input electrode 175 are formed on the ohmic contacts 163 and 165 and the insulating layer 140, and a passivation layer 802 is formed thereon. A pixel electrode 190 is formed on the passivation layer 802. An organic light emitting member 70 and a partition 803 surrounding the organic light emitting member 70 are formed on the pixel electrode 190. A common electrode 270 is formed on the light emitting member 70.

However, unlike the OLED display shown in FIG. 1, in the OLED display shown in FIG. 3, the reflective plate 120 is not formed on the substrate 110, but formed under the substrate 110 and disposed between the substrate 110 and the lenses 130.

Now, the efficiency of outward light emission of an exemplary embodiment of an OLED display according to the present invention will be described in detail with reference FIG. 4.

Figure 4:
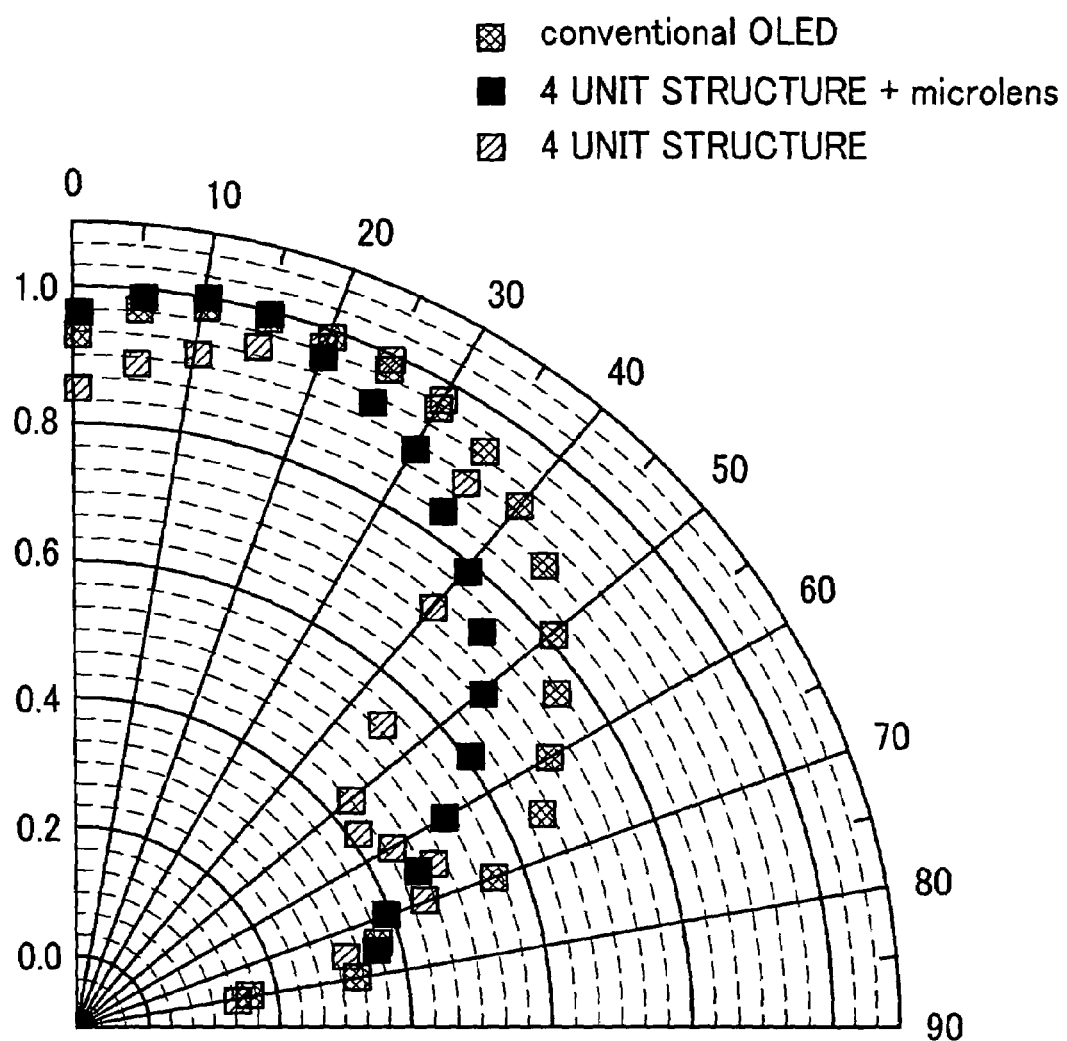
FIG. 4 is a graph showing the efficiency of outward light emission of a conventional OLED display and an exemplary embodiment of an OLED display according to the present invention.

FIG. 4 is a graph showing the efficiency of outward light emission of a conventional OLED display and an exemplary embodiment of an OLED display according to the present invention.

As shown in FIG. 4, the OLED display including both the Bragg reflective plate 120 and the lenses 130 shows less variation of light emission as compared with the conventional OLED display including only the reflective plate 120.

Referring to a following table, the OLED display including both the Bragg reflective plate 120 and the lenses 130 has considerably improved luminance and efficiency as compared with the OLED display without the reflective plate 120 and the lenses 130 and as compared with the OLED display having only the reflective plate 120.

|  | conventional | 4 unit structure | 4 unit structure + microlens |
|---|---|---|---|
| Cd/A | 7.53 | 11.23 | 13.35 |
| Relative Efficiency | 1 | 1.49 | 1.77 |

According to the present invention, the micro lenses reduce the destruction of the light at the boundary surfaces of a glass substrate and air due to the total reflection, thereby improving efficiency of outward light emission. The micro lens film having randomly distributed micro lenses serves as a diffusion film to interfere with the straightness of the emitted light, thereby reducing the variance of the color coordinates and the light intensity depending on the viewing directions.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A display device comprising:
 a transparent substrate having a first surface and a second surface;

a first electrode which is transparent and formed on the first surface of the substrate;

a light emitting layer formed on the first electrode;

a second electrode formed on the light emitting layer;

a reflective plate formed between the first surface of the substrate and the first electrode and comprising a plurality of thin films and;

a thin film transistor disposed between the reflective plate and the first electrode and coupled to the first electrode.

2. The display device of claim 1, wherein the thin films comprise organic material.

3. The display device of claim 1, wherein the thin films comprise inorganic material.

4. The display device of claim 1, wherein the thin films comprise an organic film and an inorganic film.

5. The display device of claim 1, wherein the thin films comprise silicon nitride or silicon oxide.

6. The display device of claim 1, wherein the reflective plate comprises a Bragg reflective plate.

7. A display device comprising:

a transparent substrate having a first surface and a second surface;

a first electrode which is transparent and formed on the first surface of the substrate;

a light emitting layer formed on the first electrode;

a second electrode formed on the light emitting layer;

a reflective plate formed on the second surface of the substrate, and a thin film transistor disposed between the reflective plate and the first electrode and coupled to the first electrode.

8. The display device of claim 7, wherein the thin films comprise organic material, inorganic material or both.

9. The display device of claim 7, wherein the thin films comprise silicon nitride or silicon oxide.

10. The display device of claim 7, wherein the reflective plate comprises a Bragg reflective plate.

11. The display device of claim 1, wherein the plurality of thin films comprise at least two thin films having different refractive indexes and are alternately laminated.

12. The display device of claim 7, wherein the plurality of thin films comprise at least two thin films having different refractive indexes and are alternately laminated.

13. The display device of claim 1, further comprising a plurality of lenses disposed randomly on the second surface of the substrate.

14. The display device of claim 7, further comprising a micro lens film formed on the reflective plate.

15. The display device of claim 13, wherein each of the plurality of lenses is smaller than the first electrode.

16. The display device of claim 5, wherein each of the plurality of lenses has a diameter equal to or less than about 5 microns.

17. The display device of claim 13, wherein each of the plurality of lenses comprises a concave lens or a convex lens.

18. The display device of claim 14, wherein the micro lens film comprises a plurality of micro lenses.

19. The display device of claim 18, wherein each of the plurality of micro lenses is smaller than the first electrode.

20. The display device of claim 18, wherein each of the plurality of micro lenses comprises a concave lens or a convex lens.

21. The display device of claim 18, wherein the plurality of micro lenses is randomly distributed.

22. The display device of claim 14, wherein the micro lens film comprises a plurality of a concave lenses or a plurality of convex lenses.

* * * * *